(12) United States Patent
Teng

(10) Patent No.: US 11,764,091 B2
(45) Date of Patent: Sep. 19, 2023

(54) SEMICONDUCTOR WAFER CASSETTE WAREHOUSE TRANSPORTATION STRUCTURE SYSTEM

(71) Applicant: Eddie and Sons Technology Co., Ltd, Hsinchu County (TW)

(72) Inventor: James Teng, Hsinchu County (TW)

(73) Assignee: EDDIE AND SONS TECHNOLOGY CO., LTD, Puding Xinfeng Township (TW)

( * ) Notice: Subject to any disclaimer, the term of this patent is extended or adjusted under 35 U.S.C. 154(b) by 83 days.

(21) Appl. No.: 17/471,970

(22) Filed: Sep. 10, 2021

(65) Prior Publication Data

US 2022/0246450 A1    Aug. 4, 2022

(30) Foreign Application Priority Data

Feb. 3, 2021   (TW) .................................. 110104093

(51) Int. Cl.
*H01L 21/677* (2006.01)
*B65G 1/04* (2006.01)
*B65G 1/06* (2006.01)
*B65G 47/61* (2006.01)

(52) U.S. Cl.
CPC ........ *H01L 21/6773* (2013.01); *B65G 1/0485* (2013.01); *B65G 1/06* (2013.01); *B65G 47/61* (2013.01); *H01L 21/67706* (2013.01); *H01L 21/67712* (2013.01); *H01L 21/67715* (2013.01);
(Continued)

(58) Field of Classification Search
CPC ........... H01L 21/6773; H01L 21/67769; H01L 21/67706; H01L 21/67712; H01L 21/67715; H01L 21/67727; H01L 21/67736; H01L 21/67733; B65G 1/04;
(Continued)

(56) References Cited

U.S. PATENT DOCUMENTS

| 6,435,330 | B1 * | 8/2002 | Bonora ............ H01L 21/67763 198/346.3 |
| 2007/0157878 | A1 * | 7/2007 | Aoki ................. H01L 21/67736 700/218 |

(Continued)

FOREIGN PATENT DOCUMENTS

CN        215477480 U  *  1/2022
TW        202010698 A     3/2020

*Primary Examiner* — Gene O Crawford
*Assistant Examiner* — Abby A Jorgensen
(74) *Attorney, Agent, or Firm* — Muncy, Geissler, Olds & Lowe, P.C.

(57) ABSTRACT

A semiconductor wafer cassette warehouse transportation structure system includes a wafer cassette lift transportation structure body, a wafer cassette frame structure body, an arm structure body, an arm gripping wafer cassette structure body, and a wafer cassette warehouse structure body. The suspension support rods are suspended on a ceiling. The wafer cassette lift transportation structure body lifts the wafer cassettes to the inlet and outlet. The arm structure body grips the wafer cassettes and puts same on the tracks so that the wafer cassettes can be transported to the wafer cassette warehouse structure body to be precisely accessed. The system saves space and facilitates the access of the wafer cassettes because the wafer cassettes are stored on the wafer cassette warehouse structure body suspended on the ceiling.

5 Claims, 27 Drawing Sheets

(52) U.S. Cl.
CPC .. *H01L 21/67727* (2013.01); *H01L 21/67736* (2013.01); *B65G 2201/0297* (2013.01)

(58) Field of Classification Search
CPC ........ B65G 1/0485; B65G 1/06; B65G 47/61; B65G 2201/0297
See application file for complete search history.

(56) References Cited

U.S. PATENT DOCUMENTS

| | | | | |
|---|---|---|---|---|
| 2010/0242783 | A1* | 9/2010 | Oguro | H01L 21/67727 |
| | | | | 104/91 |
| 2013/0313071 | A1* | 11/2013 | Kasuya | H01L 21/6773 |
| | | | | 198/375 |
| 2016/0264356 | A1* | 9/2016 | Wakizaka | B65G 1/06 |
| 2019/0344978 | A1* | 11/2019 | Jun | H01L 21/67706 |

\* cited by examiner

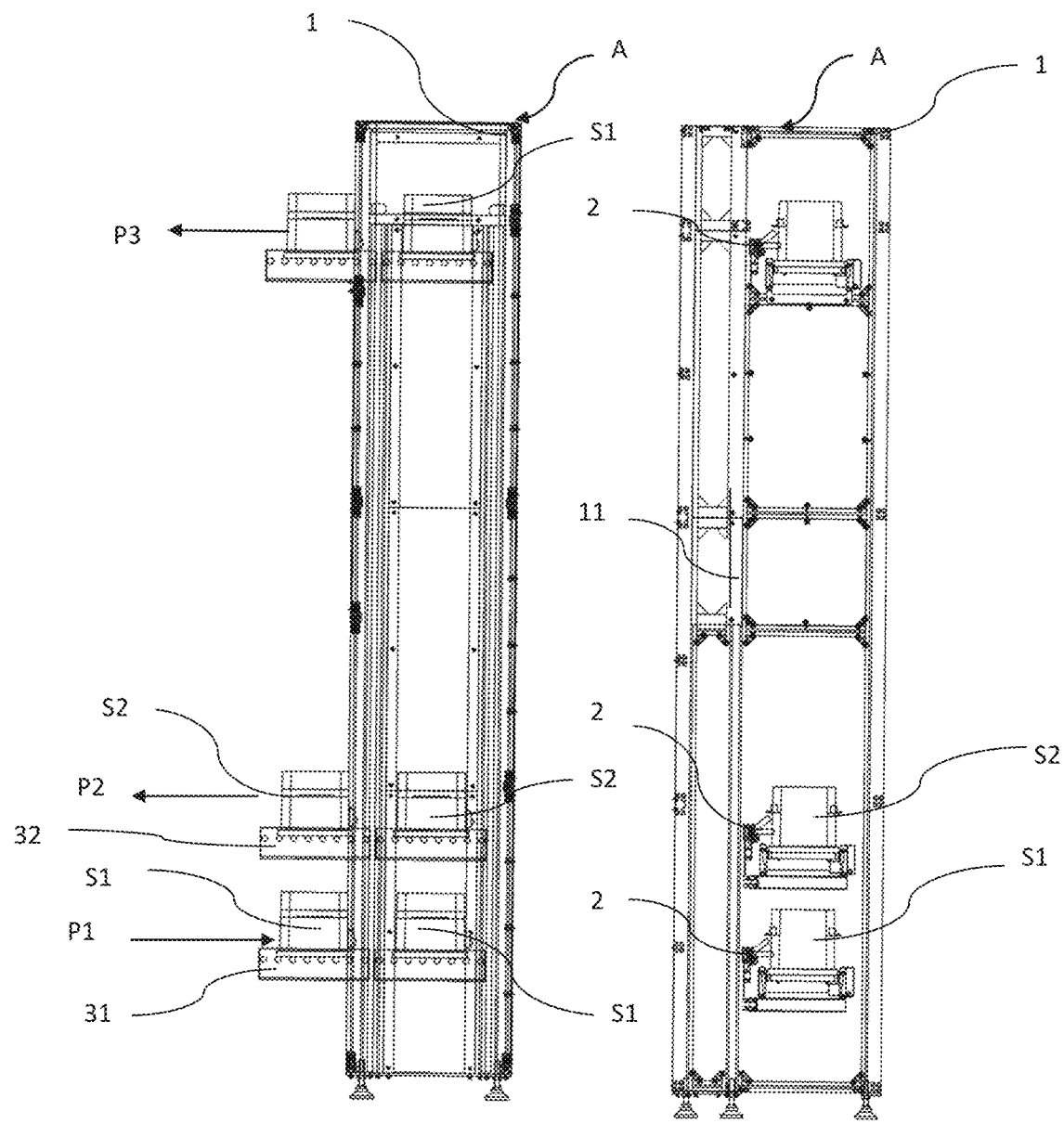

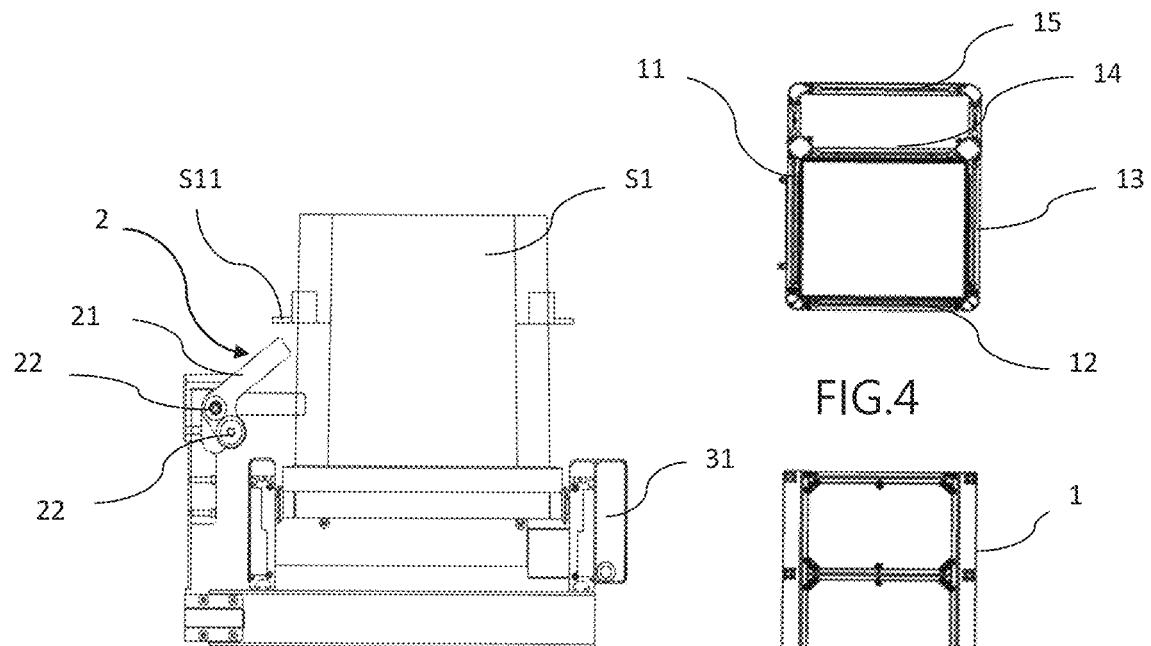
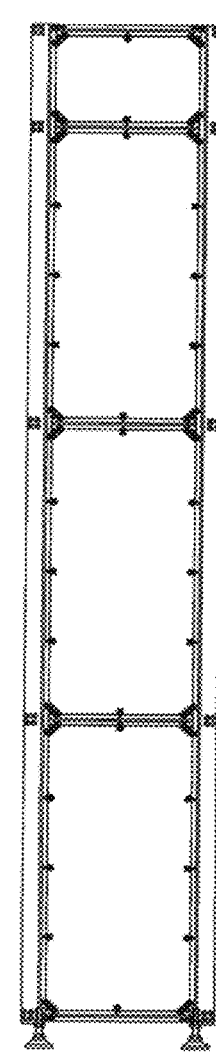
FIG.3
FIG.4
FIG.5

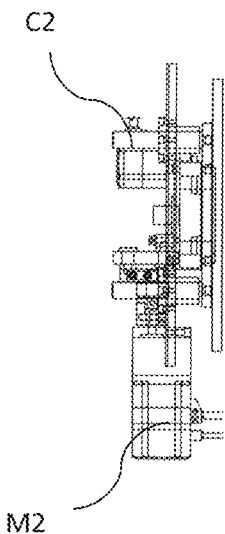
FIG.26
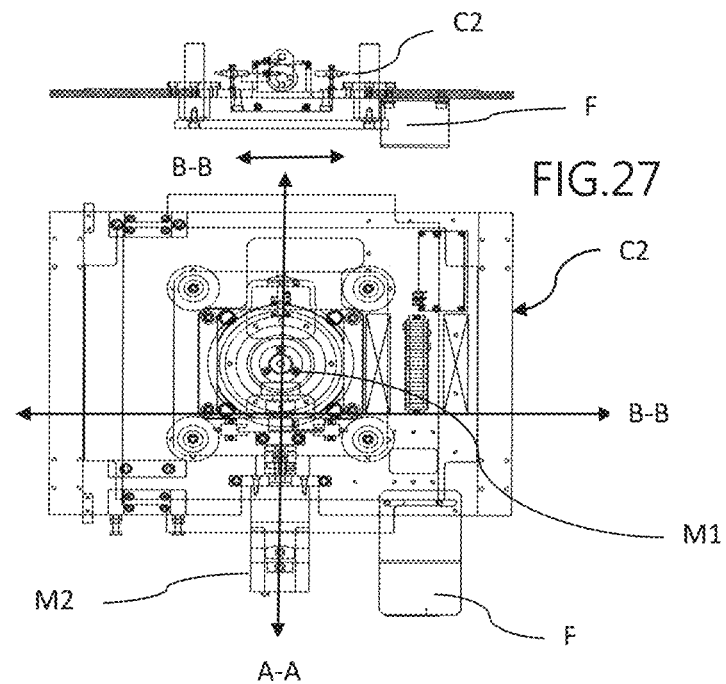
FIG.27
FIG.25
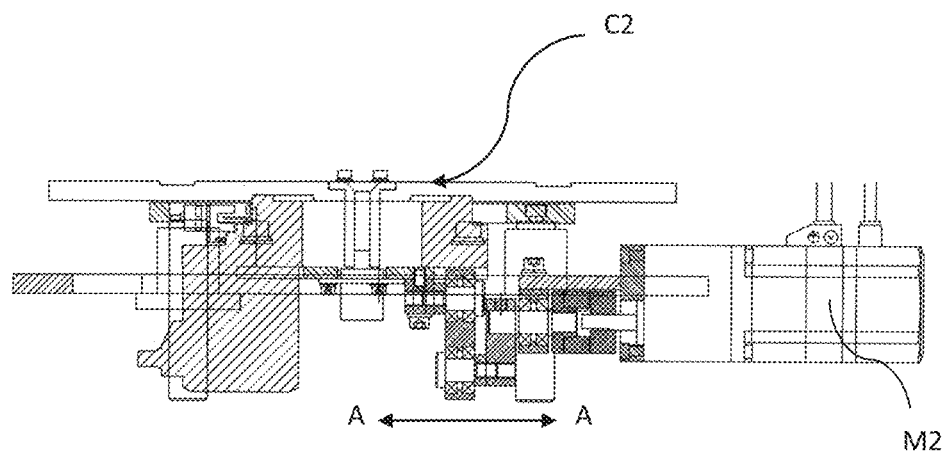
FIG.28

SEMICONDUCTOR WAFER CASSETTE WAREHOUSE TRANSPORTATION STRUCTURE SYSTEM

BACKGROUND OF THE INVENTION

1. Field of the Invention

The invention relates to a semiconductor wafer cassette warehouse transportation structure system and more particularly to such a semiconductor wafer cassette warehouse transportation structure system comprising a wafer cassette lift transportation structure body, a wafer cassette frame structure body, an arm structure body, an arm gripping wafer cassette structure body and a wafer cassette warehouse structure body.

2. Description of Related Art

Taiwan patent application number 107131751, entitled "wafer cassette storage system", comprises a rectangular frame 10, a lift device 30, a planar three-axis robot 40 and a manipulation unit human machine interface 50. The lift device 30 is at one side of the rectangular frame 10. The planar three-axis robot 40 is mounted at an intermediate portion of the rectangular frame 10. The manipulation unit human machine interface 50 is mounted a side space of the rectangular frame 10.

While the patent application solves the problem of providing a space for storing wafer cassettes, it still occupies a large ground, decreases an effective space of a factory, stores fewer wafer cassettes, and is not economically feasible.

Thus, the need for improvement still exists.

SUMMARY OF THE INVENTION

It is therefore one object of the invention to provide a semiconductor wafer cassette warehouse transportation structure system, comprising a wafer cassette lift transportation structure body, a wafer cassette frame structure body, an arm structure body, an arm gripping wafer cassette structure body, and a wafer cassette warehouse structure body wherein the wafer cassette lift transportation structure body is shaped as a parallelepiped ladder structure and includes a lift structural frame, a plurality of positioning devices, and a plurality of roller transportation devices; a plurality of robots are disposed at inlet and outlet respectively for transporting the wafer cassettes; the roller transportation devices convey the wafer cassettes to the lift structural frame; the positioning devices are provided at either side of the support rod for positioning the wafer cassettes; the wafer cassette frame structure body includes a plurality of connected tracks having two parallel rails, a plurality of suspension support rods, a plurality of auxiliary support rods, a plurality of linking rods, and a plurality of storage frames; the suspension support rods are suspended on a ceiling; the linking rods are connected to the tracks with the storage frames mounted thereon so that the wafer cassettes are configured to temporarily store on the storage frames; the arm structure body includes an arm structure and an arm seat; two arm tracks are provided at two sides of the arm structure respectively and are extended to a side wing at either side of the wafer cassette so that the wafer cassettes are configured to access; and in the arm gripping wafer cassette structure body, the arm structure grips the wafer cassettes and puts the wafer cassettes on the tracks so that the wafer cassettes can be transported to the wafer cassette warehouse structure body to be precisely accessed. As a result, the purpose of automatically accessing the semiconductor wafer cassettes is achieved.

The above and other objects, features and advantages of the invention will become apparent from the following detailed description taken with the accompanying drawings.

BRIEF DESCRIPTION OF THE DRAWINGS

FIG. 1 schematically depicts a wafer cassette lift transportation structure body of a semiconductor wafer cassette warehouse transportation structure system according to the invention;

FIG. 2 is a front view of the wafer cassette lift transportation structure body of the semiconductor wafer cassette warehouse transportation structure system of the invention;

FIG. 3 schematically depicts a positioning device of the wafer cassette lift transportation structure body of the semiconductor wafer cassette warehouse transportation structure system of the invention;

FIG. 4 is a top view of the wafer cassette lift transportation structure body of the semiconductor wafer cassette warehouse transportation structure system of the invention;

FIG. 5 is a right side view of the wafer cassette lift transportation structure body of the semiconductor wafer cassette warehouse transportation structure system of the invention;

FIG. 25 is a top view of the arm seat of the semiconductor wafer cassette warehouse transportation structure system of the invention;

FIG. 26 is a front view of the arm seat of the semiconductor wafer cassette warehouse transportation structure system of the invention;

FIG. 27 is a sectional view taken along line B-B of FIG. 25 showing the arm seat of the semiconductor wafer cassette warehouse transportation structure system of the invention;

FIG. 28 is a sectional view taken along line A-A of FIG. 25 showing the arm seat of the semiconductor wafer cassette warehouse transportation structure system of the invention;

DETAILED DESCRIPTION OF THE INVENTION

Figure 56:
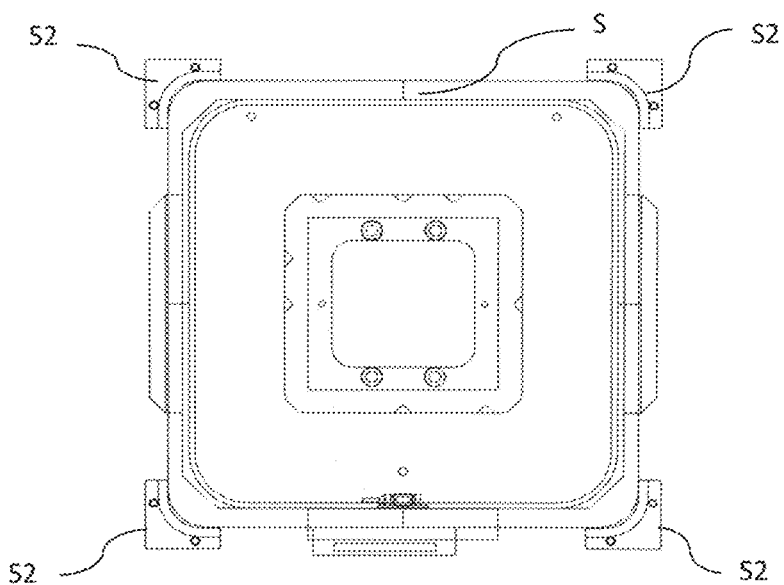
FIG. 56 is a top view showing positioning of the wafer cassette warehouse structure body being a wafer cassette warehouse of the semiconductor wafer cassette warehouse transportation structure system of the invention.

Referring to FIGS. 1 to 56, a semiconductor wafer cassette warehouse transportation structure system in accordance with the invention comprises a wafer cassette lift transportation structure body A, a wafer cassette frame structure body B, an arm structure body C, an arm gripping wafer cassette structure body D and a wafer cassette warehouse structure body E in which the wafer cassette lift transportation structure body A shaped as a parallelepiped ladder structure and includes a lift structural frame 1, a plurality of positioning devices 2, and roller transportation devices 31 and 32.

As shown in FIGS. 1 to 7 specifically, the lift structural frame 1 includes a plurality of support rods 11, 12, 13, 14 and 15 and is shaped as a rectangular frame. The positioning devices 2 are provided at either side of the support rod 11 and each position device 2 includes two rollers 22 and a block member 21 secured to the rollers 22. The wafer cassette S1 has two side wings S11. The wafer cassettes S1, S2 are provided on two roller transportation devices 31, 32. Robots are disposed at inlet and outlet respectively for transporting the wafer cassettes S1, S2 and the roller transportation devices 31, 32 are used to convey the wafer cassettes S1, S2 to the lift structural frame 1. The roller transportation device 31 conveys the wafer cassette S1 along the input direction P1 and the roller transportation device 32 conveys the wafer cassette S2 along the output direction P2.

Figure 6:
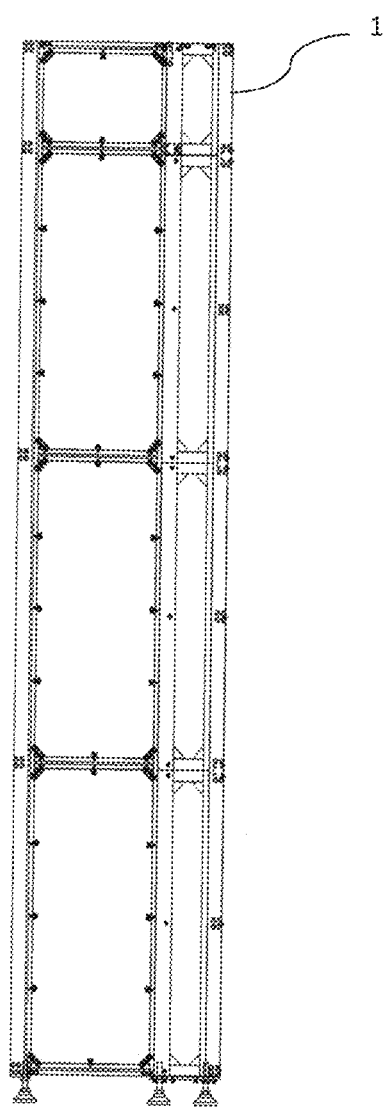
FIG. 6 is a rear view of the wafer cassette lift transportation structure body of the semiconductor wafer cassette warehouse transportation structure system of the invention.
Figure 7:
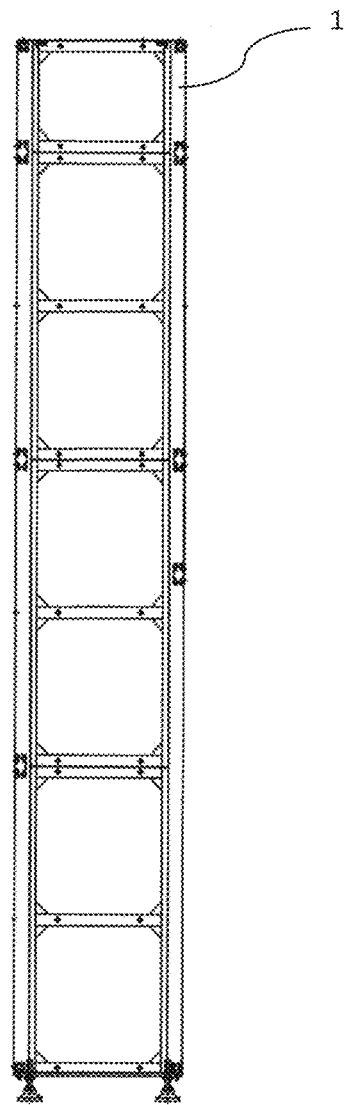
FIG. 7 is a left side view of the wafer cassette lift transportation structure body of the semiconductor wafer cassette warehouse transportation structure system of the invention.
Figure 8:
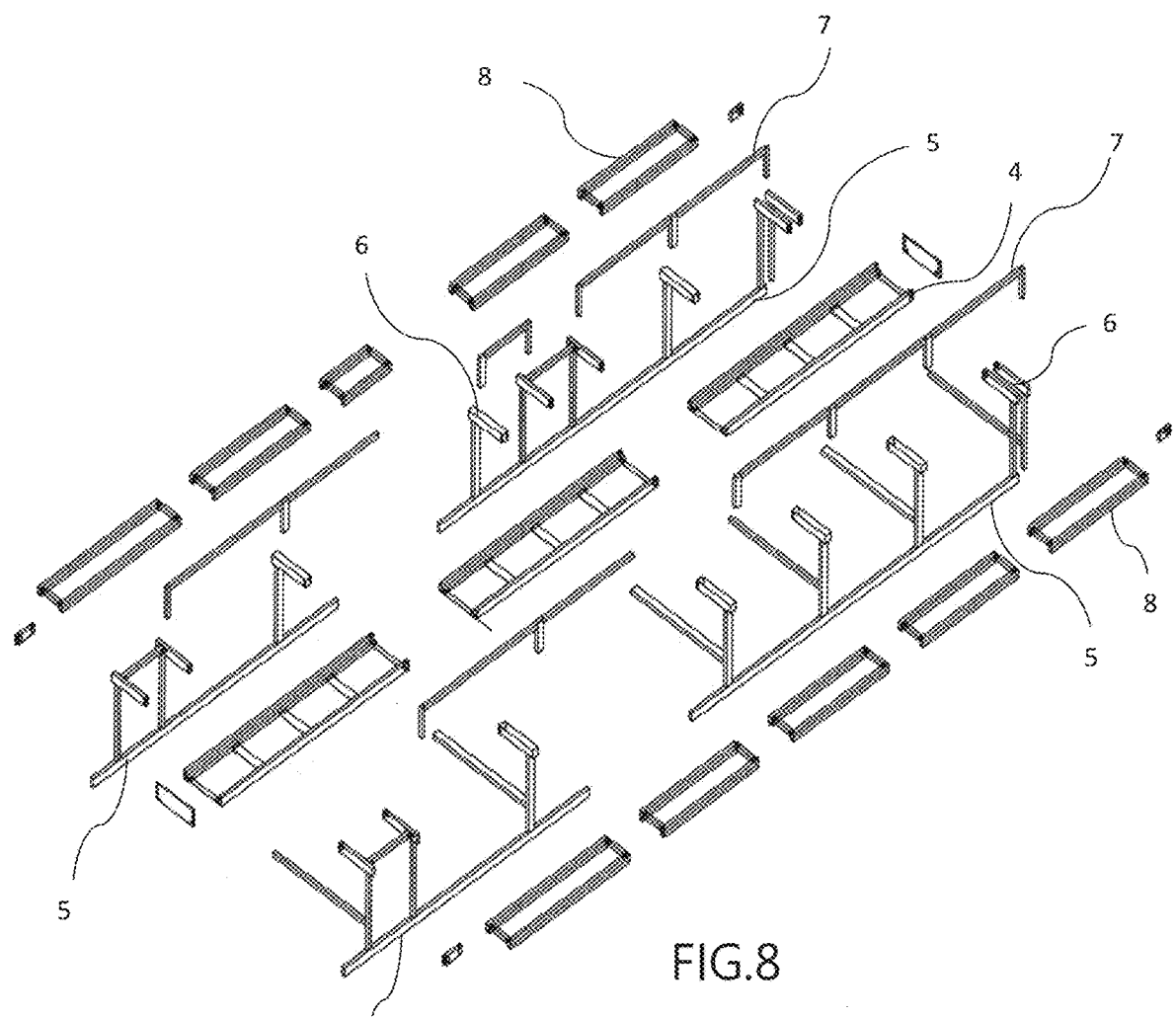
FIG. 8 is an exploded view of the wafer cassette storage structure body of the semiconductor wafer cassette warehouse transportation structure system of the invention.
Figure 9:
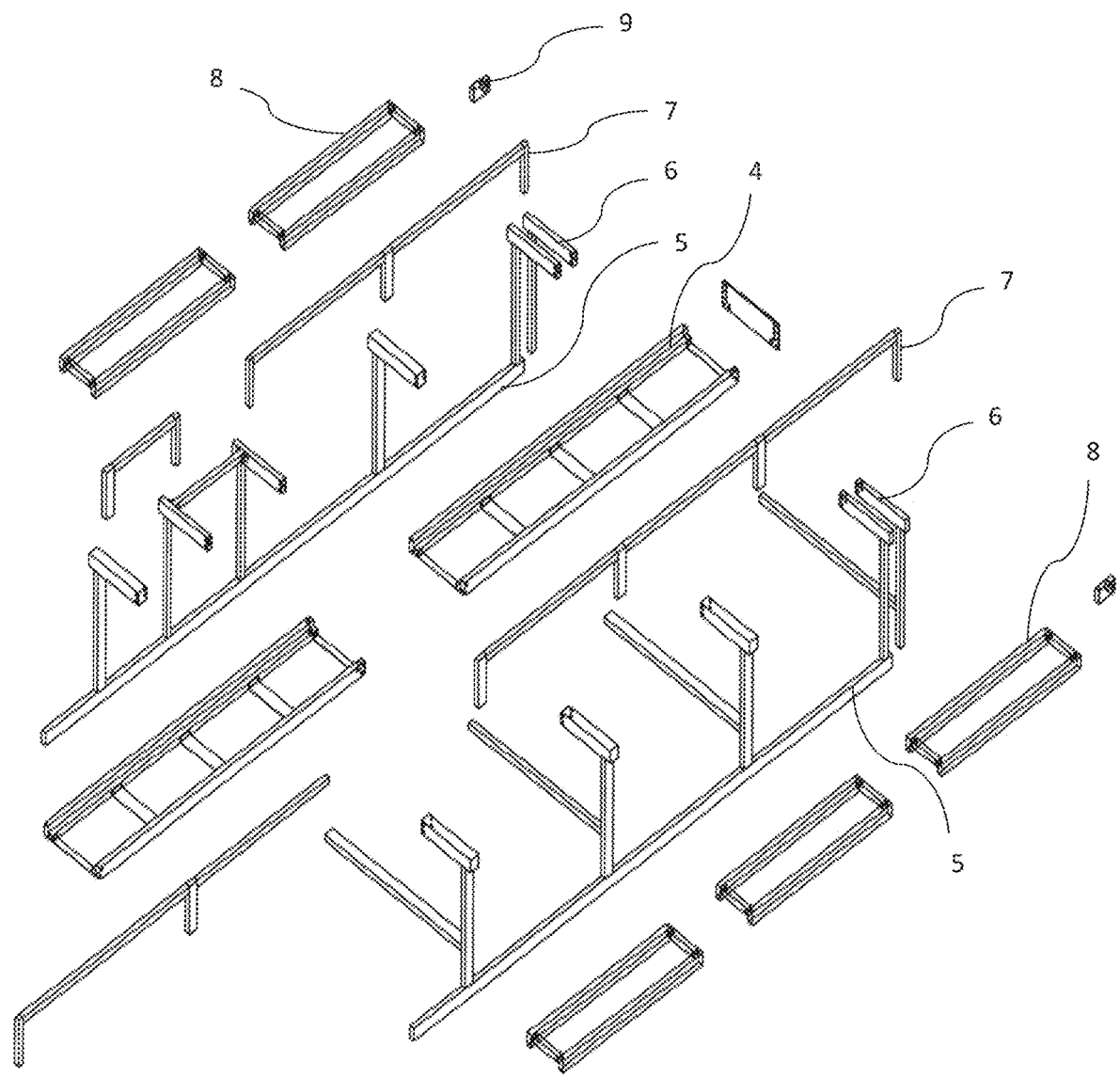
FIG. 9 is a partially exploded view of the wafer cassette frame structure body of the semiconductor wafer cassette warehouse transportation structure system of the invention.
Figure 10:
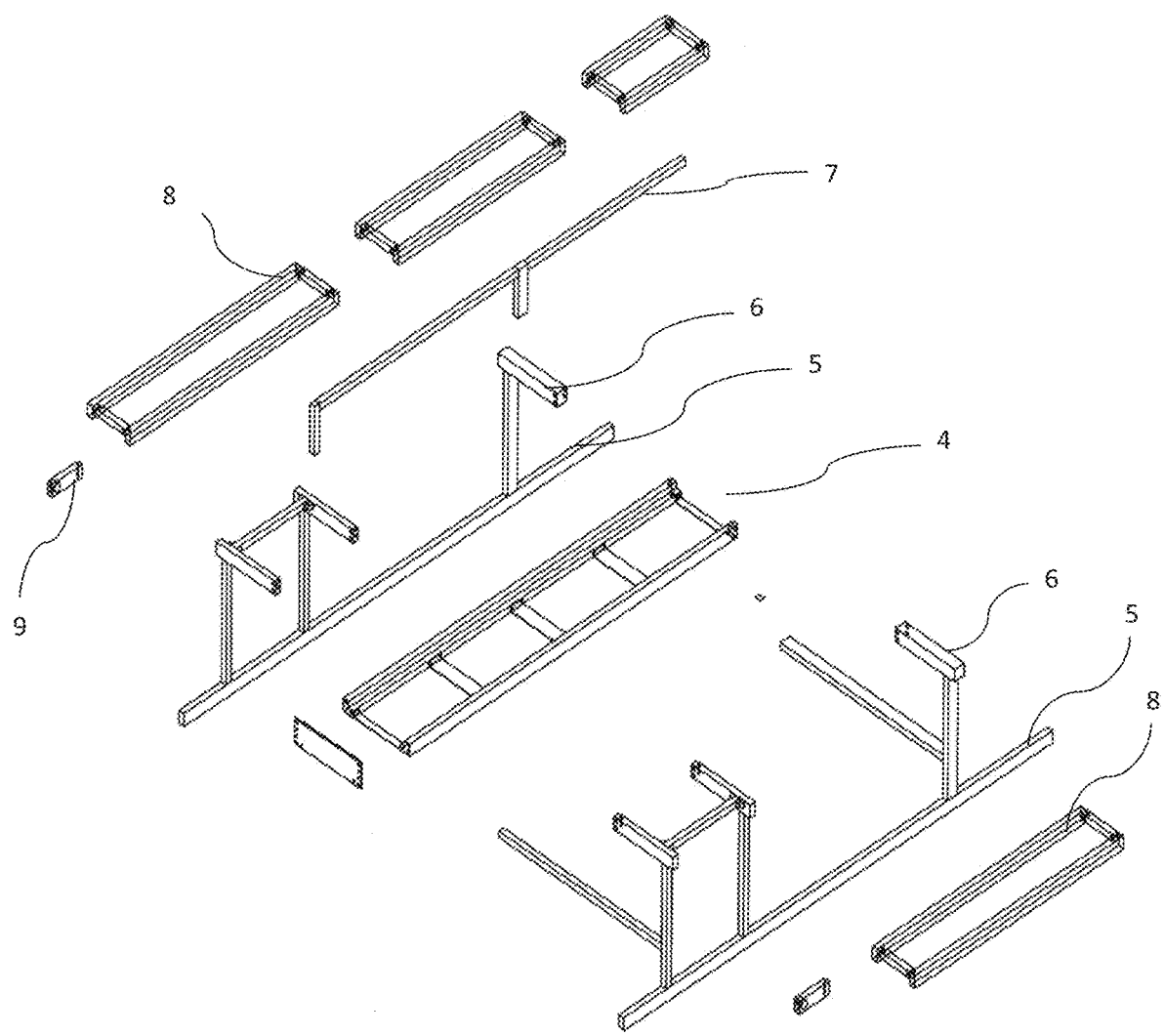
FIG. 10 is another partially exploded view of the wafer cassette frame structure body of the semiconductor wafer cassette warehouse transportation structure system of the invention.
Figure 11:
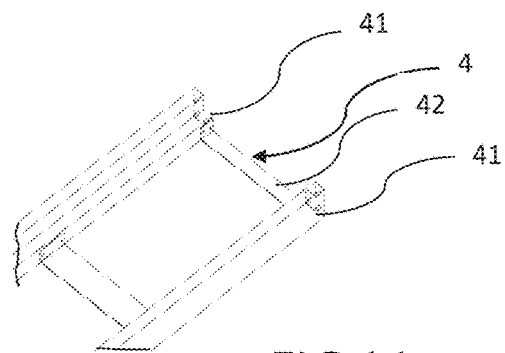
FIG. 11 is a partially perspective view of the rail frame of the wafer cassette frame structure body of the semiconductor wafer cassette warehouse transportation structure system of the invention.
Figure 12:
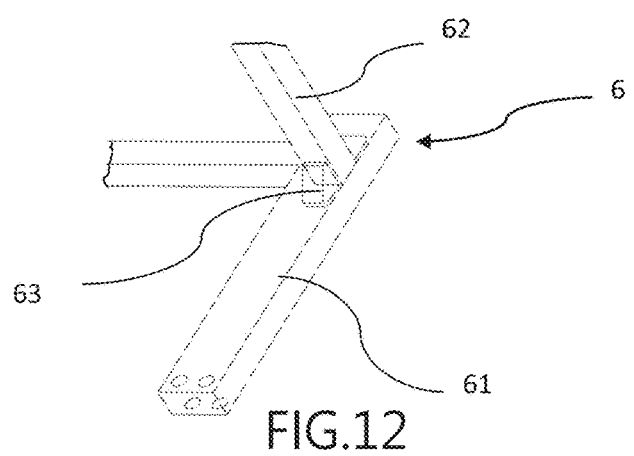
FIG. 12 schematically depicts the auxiliary support rod of the wafer cassette frame structure body of the semiconductor wafer cassette warehouse transportation structure system of the invention, the auxiliary support rod being assembled by the L-shaped rod and the transverse rod by means of the triangular block.
Figure 13:
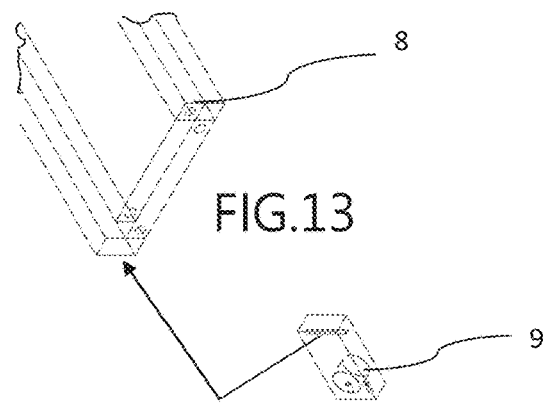
FIG. 13 schematically depicts the storage frame and the auxiliary block of the wafer cassette frame structure body of the semiconductor wafer cassette warehouse transportation structure system of the invention.
Figure 14:
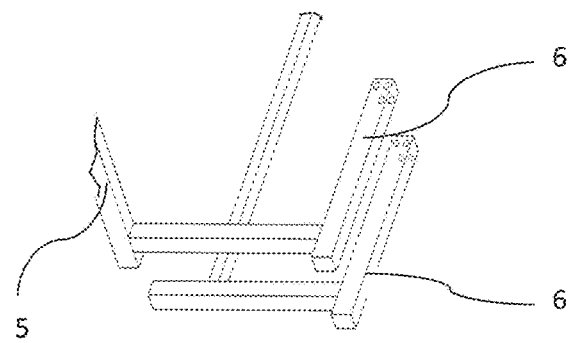
FIG. 14 schematically depicts the auxiliary support rod and the suspension support rod of the wafer cassette frame structure body of the semiconductor wafer cassette warehouse transportation structure system of the invention.
Figure 15:
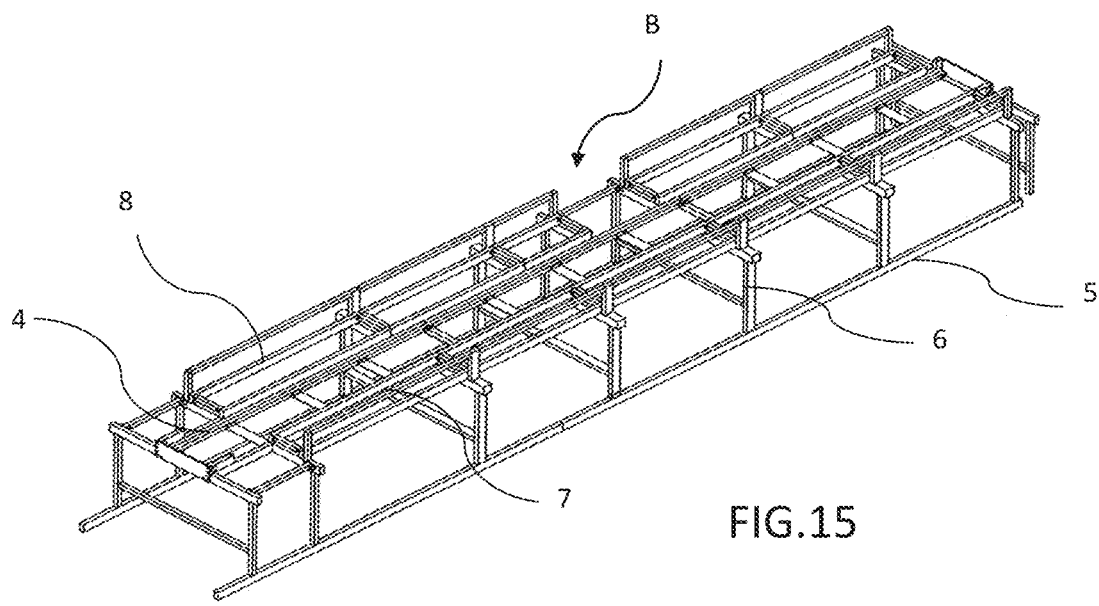
FIG. 15 is a perspective view of the wafer cassette frame structure body of the semiconductor wafer cassette warehouse transportation structure system of the invention.
Figure 16:
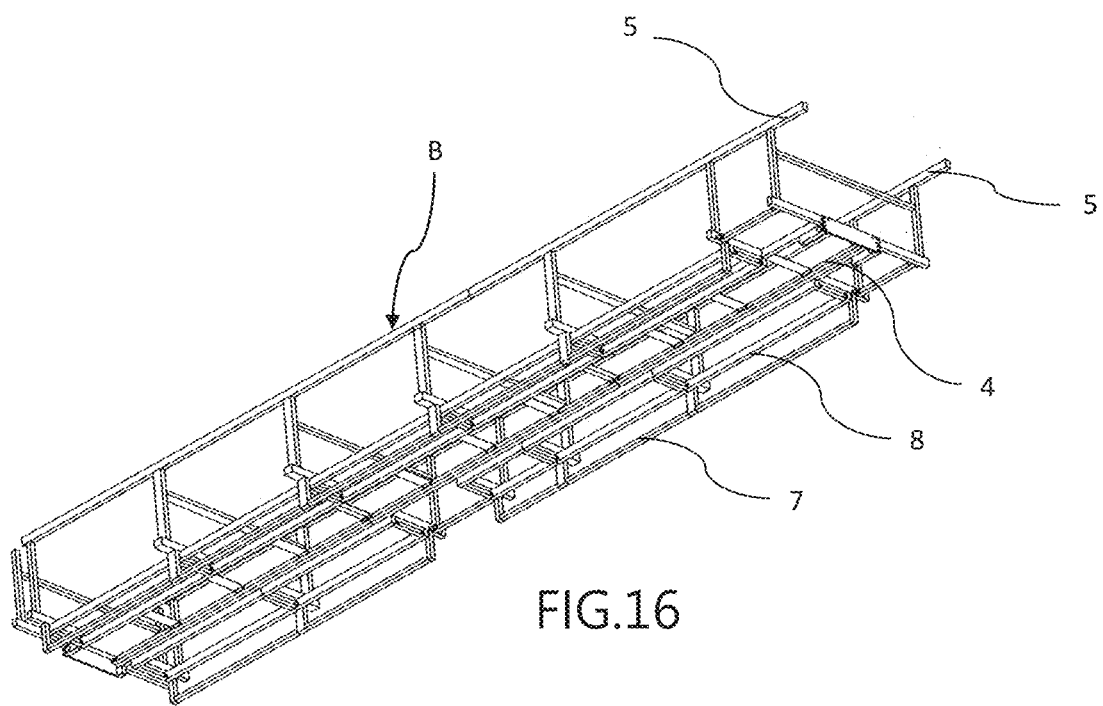
FIG. 16 is another perspective view of the wafer cassette frame structure body of the semiconductor wafer cassette warehouse transportation structure system of the invention.
Figure 17:
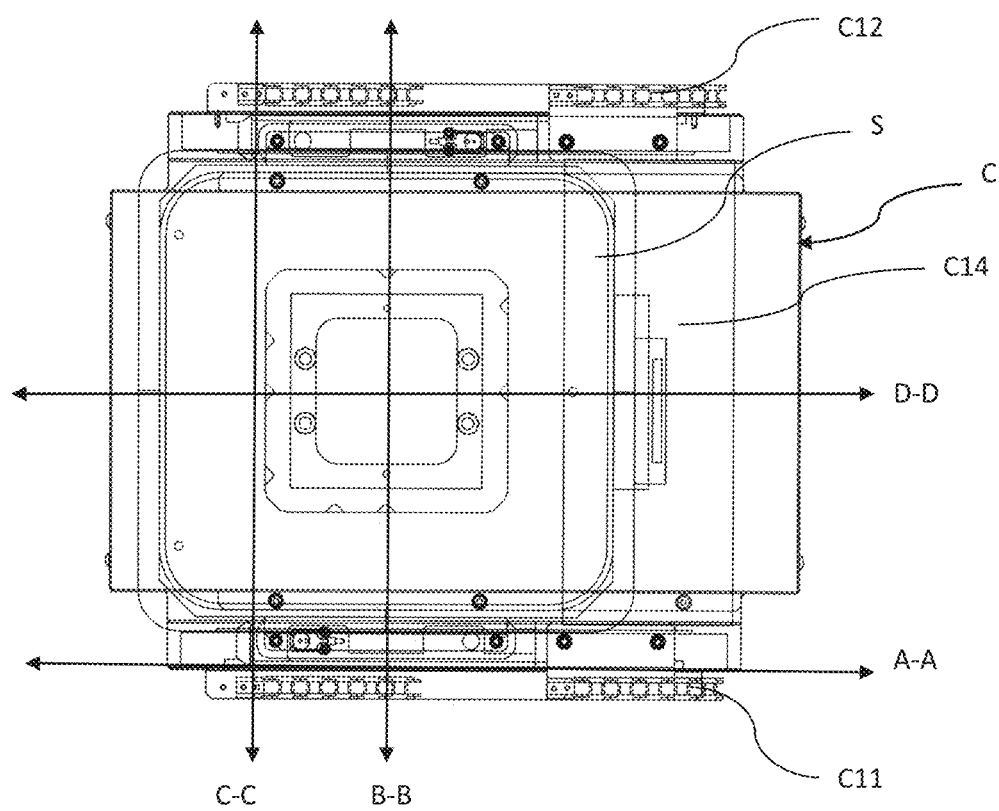
FIG. 17 is a top view of the arm structure of the semiconductor wafer cassette warehouse transportation structure system of the invention.
Figure 18:
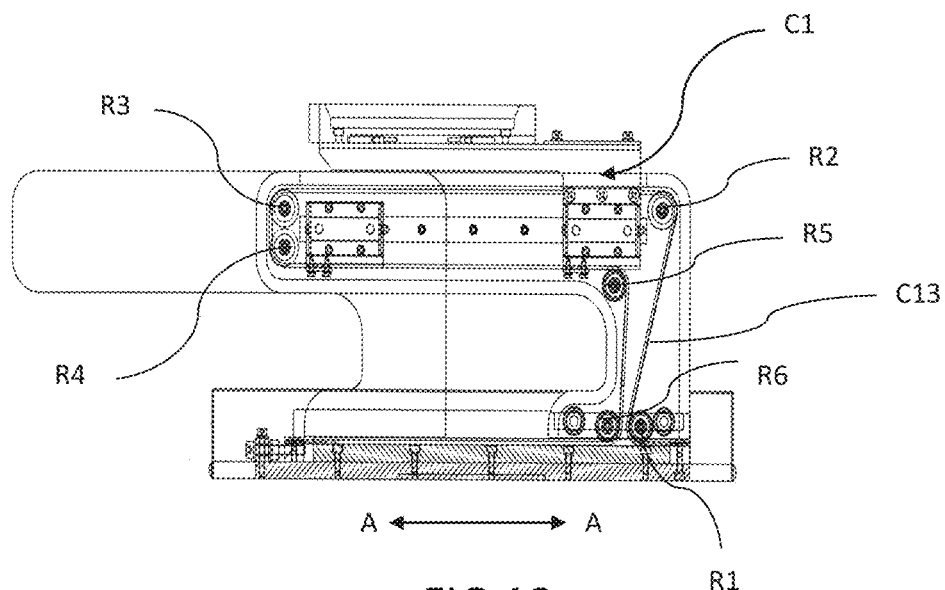
FIG. 18 is a sectional view taken along line A-A of FIG. 17 showing the arm structure of the semiconductor wafer cassette warehouse transportation structure system of the invention.

As shown in FIGS. 8 to 16 specifically, the wafer cassette frame structure body B includes a plurality of connected tracks 4, a plurality of suspension support rods 5, a plurality of auxiliary support rods 6, a plurality of linking rods 7 and a plurality of storage frames 8. The wafer cassette S1 moves on the tracks 4. The suspension support rods 5 are suspended on the ceiling and connected to the auxiliary support rods 6. The linking rods 7 are connected to the tracks 4 with the storage frames 8 mounted thereon so that the wafer cassettes can be temporarily stored on the storage frames 8. In FIG. 11, it shows that the track 4 includes two parallel rails 41 and two parallel U-shaped connecting plates 42 interconnected the rails 41. In FIG. 12, it shows the auxiliary support rod 6 includes an L-shaped rod 61, a cross rod 62 and a triangular block 63 joined the L-shaped rod 61 and the cross rod 62 together. FIG. 13 schematically depicts the storage frame 8 and the auxiliary block 9 being separated. FIG. 14 schematically depicts the auxiliary support rod 6 and the suspension support rod 5.

Figure 19:
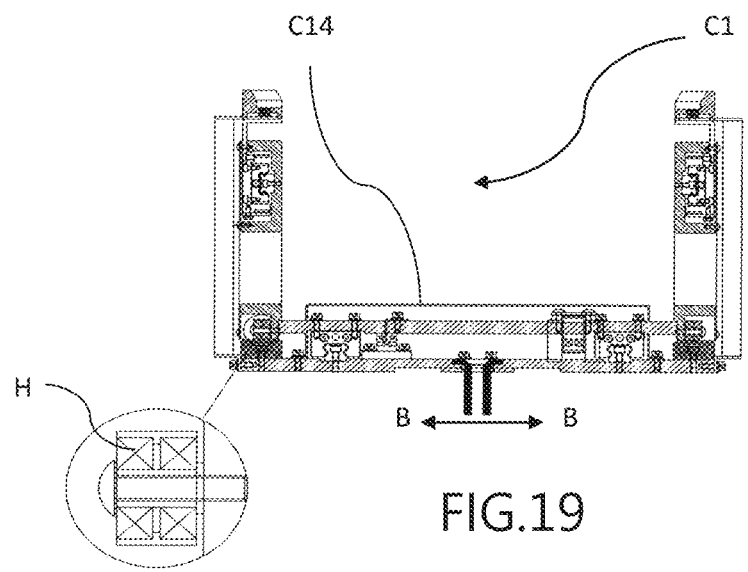
FIG. 19 is a sectional view taken along line B-B of FIG. 17 showing the arm structure of the semiconductor wafer cassette warehouse transportation structure system of the invention.
Figure 20:
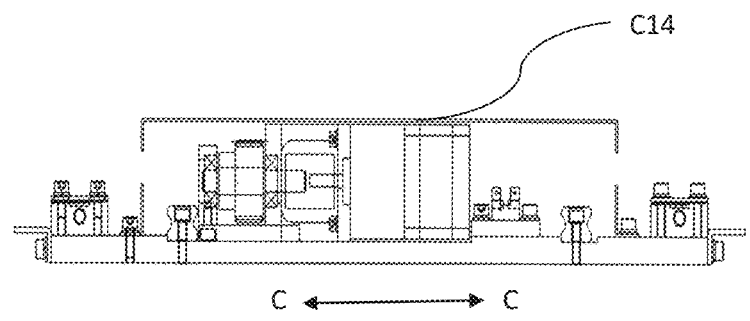
FIG. 20 is a sectional view taken along line C-C of FIG. 17 showing the arm structure of the semiconductor wafer cassette warehouse transportation structure system of the invention.
Figure 21:
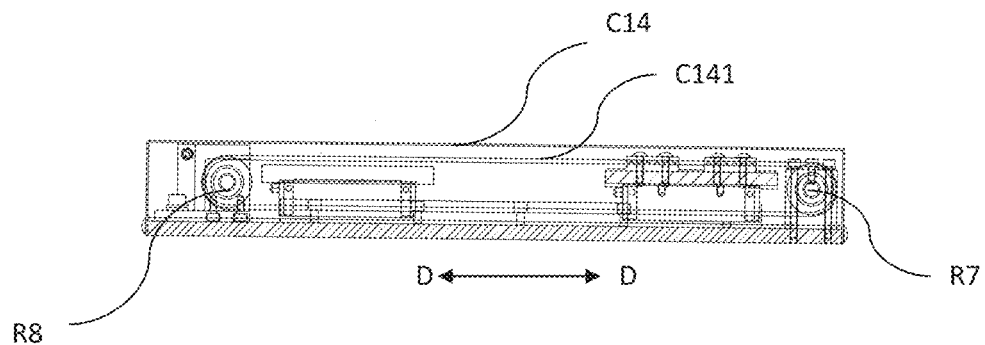
FIG. 21 is a sectional view taken along line D-D of FIG. 17 showing the arm structure of the semiconductor wafer cassette warehouse transportation structure system of the invention.
Figure 22:
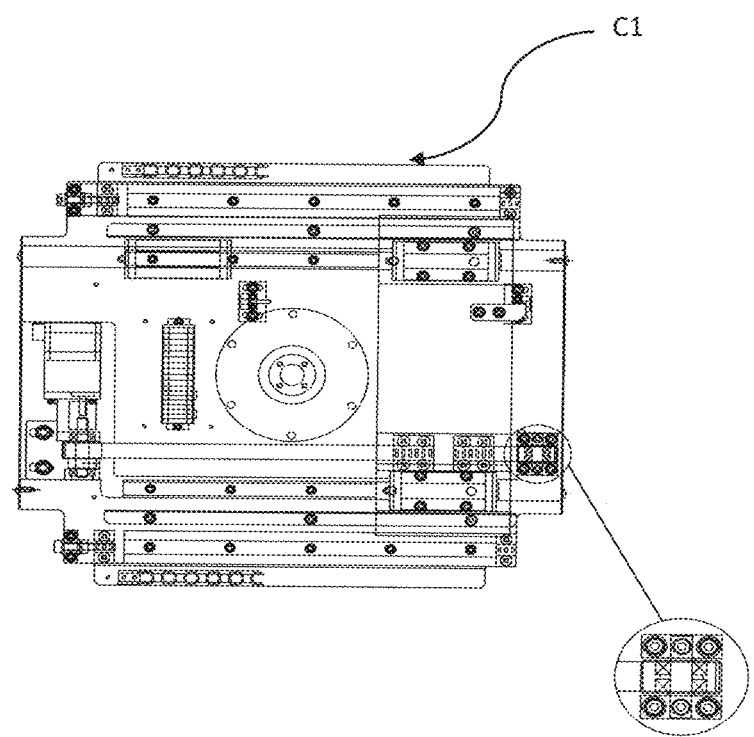
FIG. 22 is a bottom view of the arm structure of the semiconductor wafer cassette warehouse transportation structure system of the invention.
Figure 23:
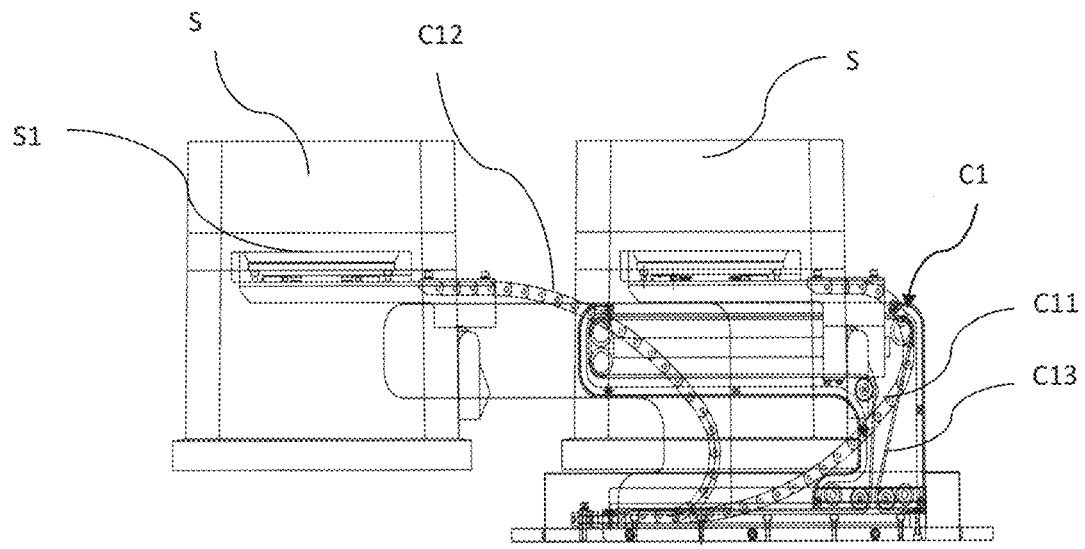
FIG. 23 schematically depicts the arm structure gripping the wafer cassette of the semiconductor wafer cassette warehouse transportation structure system of the invention.
Figure 24:
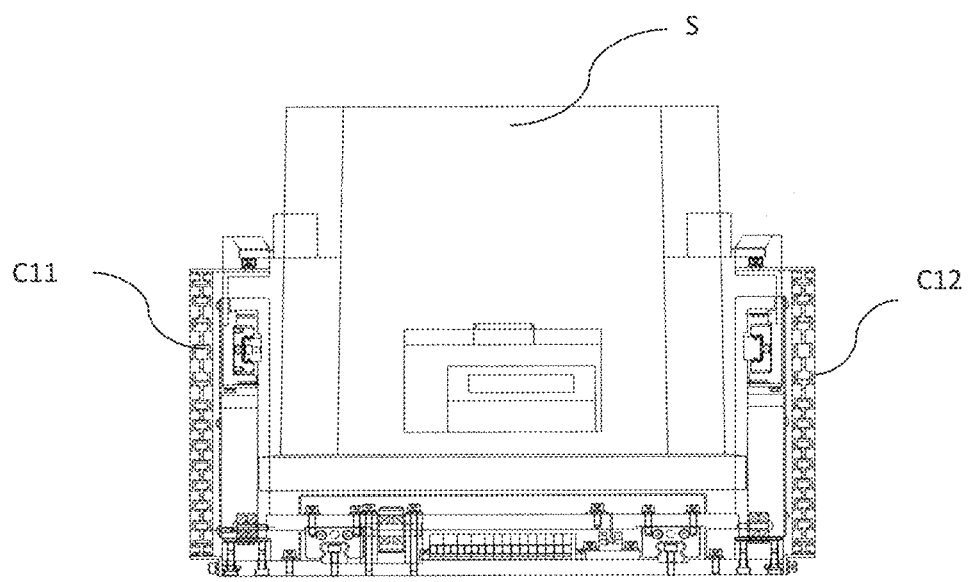
FIG. 24 is a right side view of the arm structure gripping the wafer cassette of the semiconductor wafer cassette warehouse transportation structure system of the invention.
Figure 29:
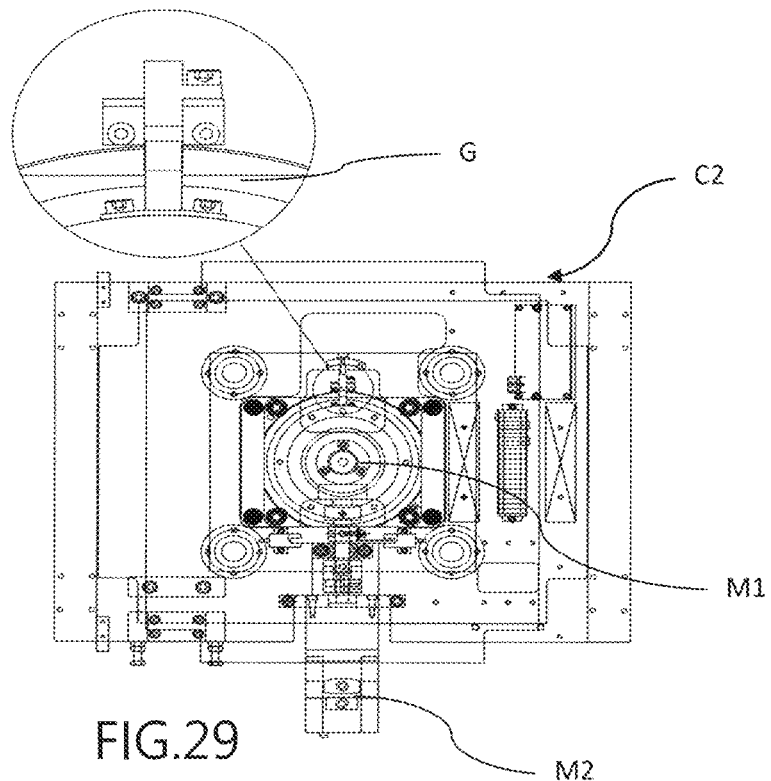
FIG. 29 is a top view of the arm seat of the semiconductor wafer cassette warehouse transportation structure system of the invention.
Figure 30:
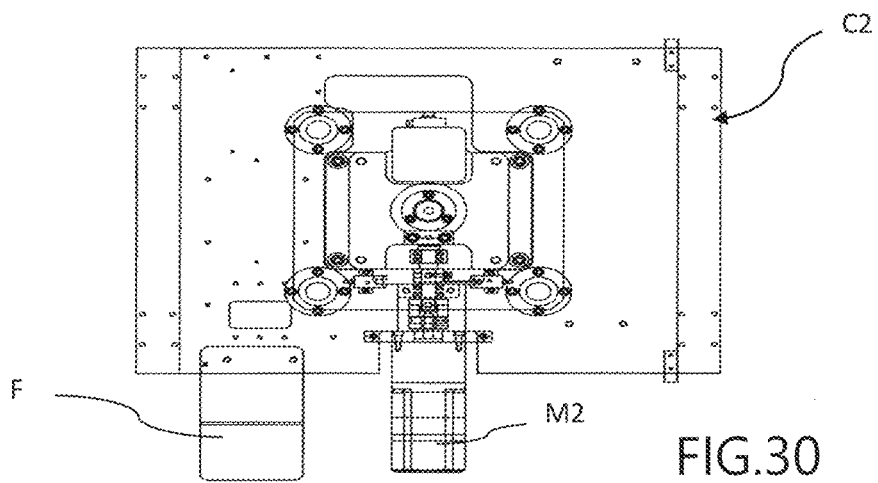
FIG. 30 is a bottom view of the arm seat of the semiconductor wafer cassette warehouse transportation structure system of the invention.
Figure 31:
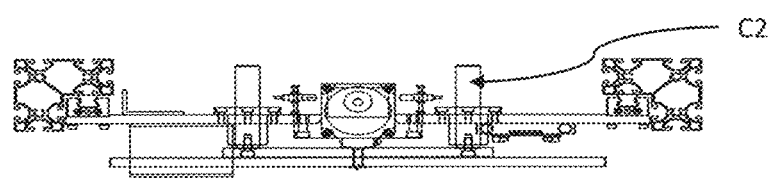
FIG. 31 is a bottom, side view of the arm seat of the semiconductor wafer cassette warehouse transportation structure system of the invention.
Figure 32:
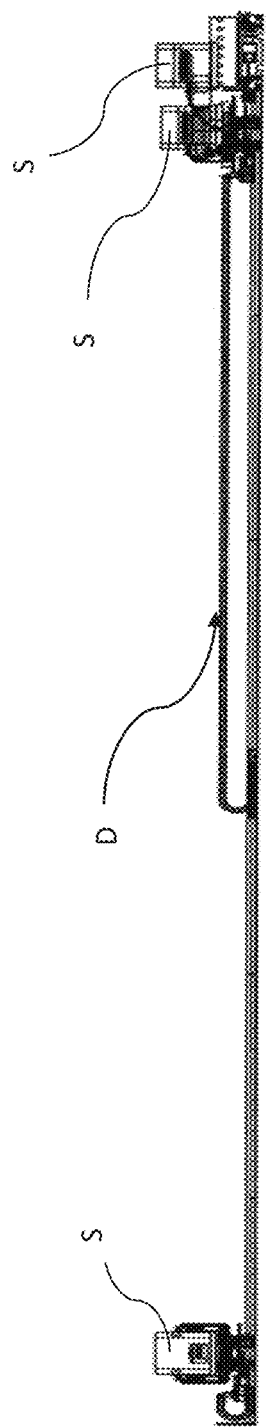
FIG. 32 is a front view showing the arm gripping the wafer cassette of the semiconductor wafer cassette warehouse transportation structure system of the invention.

As shown in FIGS. 17 to 24 specifically, the arm structure body C includes an arm structure C1 and an arm seat C2. The arm structure C1 is shaped as an L and mounted across two sides of the wafer cassette seat C14. Two internal rollers R7, R8 are mounted at two sides of the wafer cassette seat C14 respectively and a belt C141 run on the rollers R7, R8. A belt C13 is mounted in the arm structure C1 and runs on rollers R1, R2, R3, R4, R5 and R6. Thus, two arm tracks C11, C12 at two sides respectively are extended to a side wing S3 at either side of the wafer cassette S. Thus, the wafer cassette S can be accessed. In FIG. 19, a thread screw H for lifting is mounted at a lower left corner of the arm structure C1.

As shown in FIGS. 25 to 29 specifically, the arm seat C2 is mounted on a bottom of the arm structure C1 and a motor M1 is mounted at an intermediate portion thereof. A position sensor G is mounted at one side of the motor M1. A motor M2 and a belt grip F are mounted at one side surface and the belt grip F grips the belt so as to activate the arm structure C1.

Figure 33:
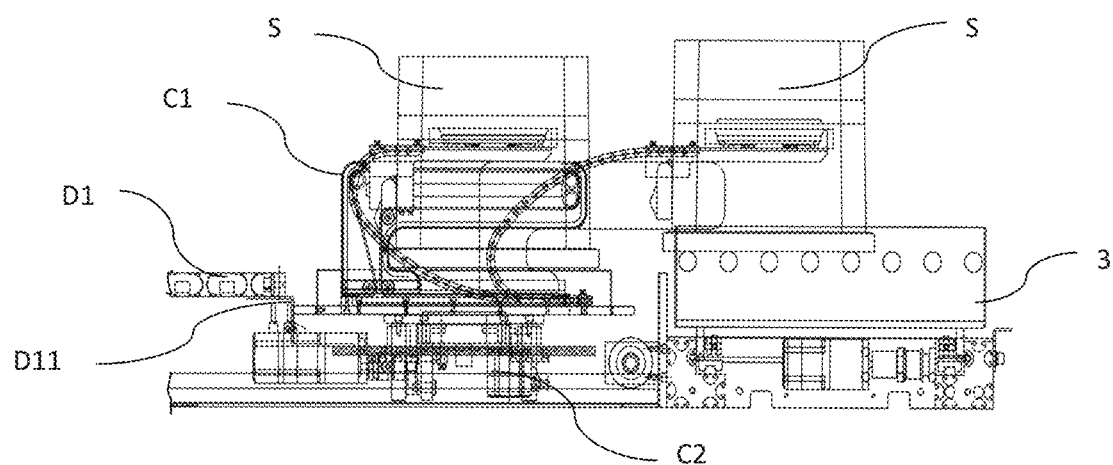
FIG. 33 is a right side view in part section showing the arm gripping the wafer cassette of the semiconductor wafer cassette warehouse transportation structure system of the invention.
Figure 34:
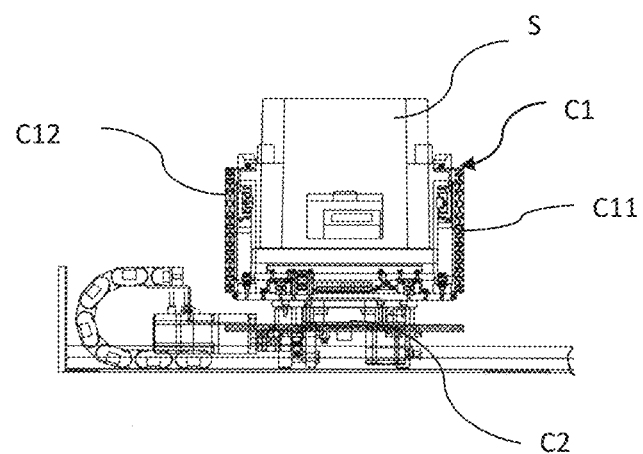
FIG. 34 is a left side view in part section showing the arm gripping the wafer cassette of the semiconductor wafer cassette warehouse transportation structure system of the invention.
Figure 35:
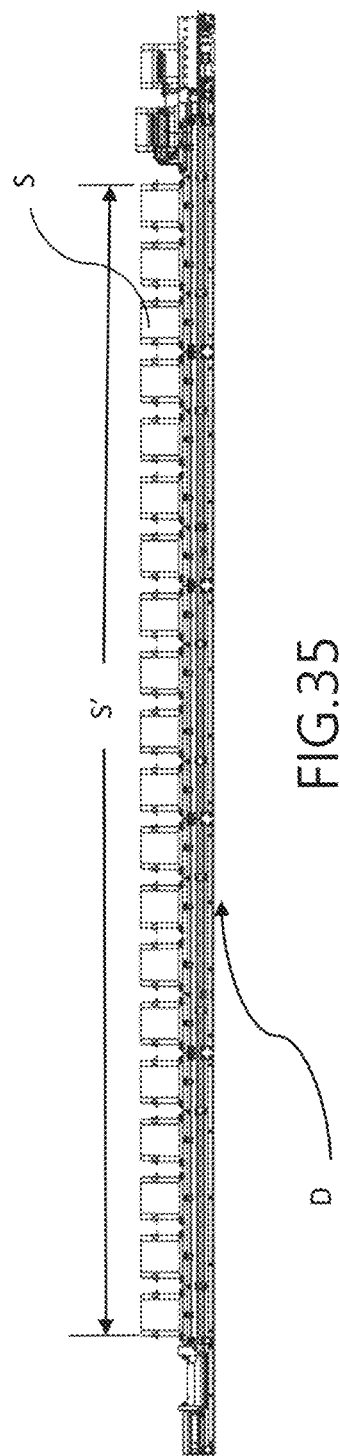
FIG. 35 is a sectional view showing the arm gripping the wafer cassette structure body wafer cassette warehouse of the semiconductor wafer cassette warehouse transportation structure system of the invention.
Figure 36:
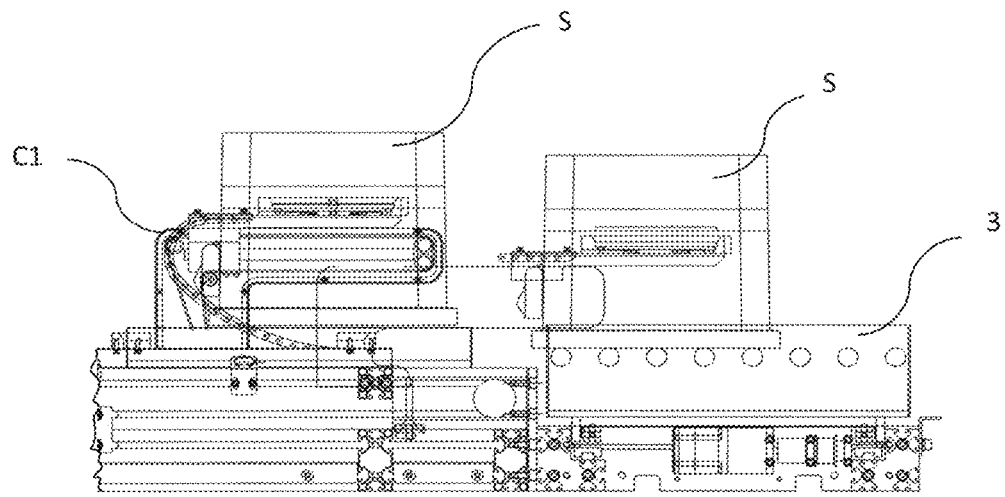
FIG. 36 is a right side view in part section showing the arm gripping the wafer cassette structure body wafer cassette warehouse of the semiconductor wafer cassette warehouse transportation structure system of the invention.
Figure 37:
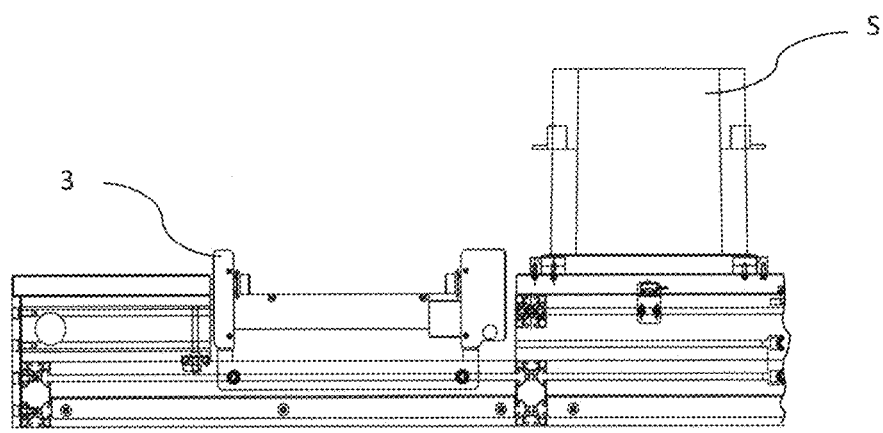
FIG. 37 is a left side view in part section showing the arm gripping the wafer cassette structure body wafer cassette warehouse of the semiconductor wafer cassette warehouse transportation structure system of the invention.
Figure 38:
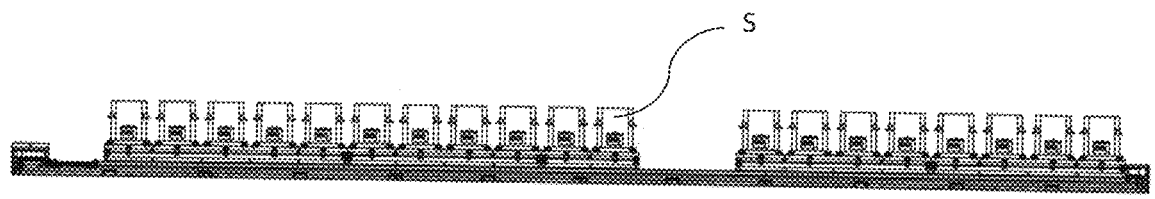
FIG. 38 schematically depicts the arm gripping the wafer cassette structure body wafer cassette warehouse arrangement of the semiconductor wafer cassette warehouse transportation structure system of the invention.
Figure 39:
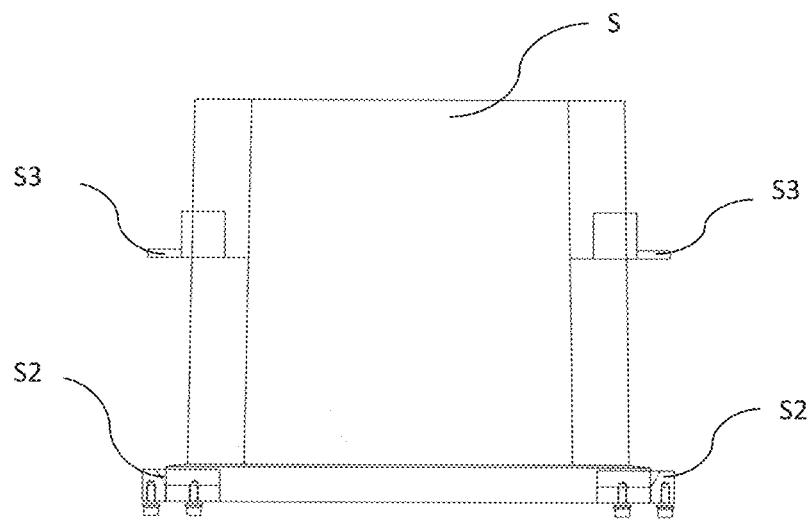
FIG. 39 schematically depicts the arm gripping the wafer cassette structure body wafer cassette warehouse positioning of the semiconductor wafer cassette warehouse transportation structure system of the invention.
Figure 40:
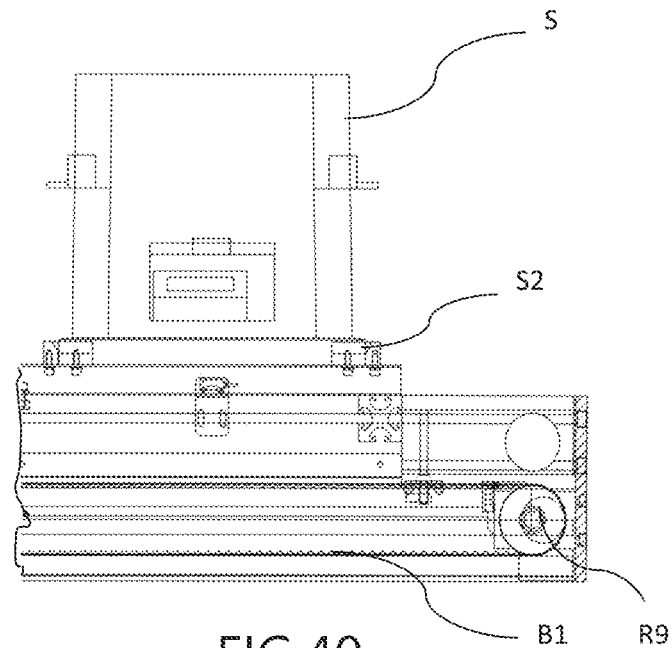
FIG. 40 is a right side schematic view of the arm gripping the wafer cassette structure body wafer cassette warehouse arrangement of the semiconductor wafer cassette warehouse transportation structure system of the invention.
Figure 41:
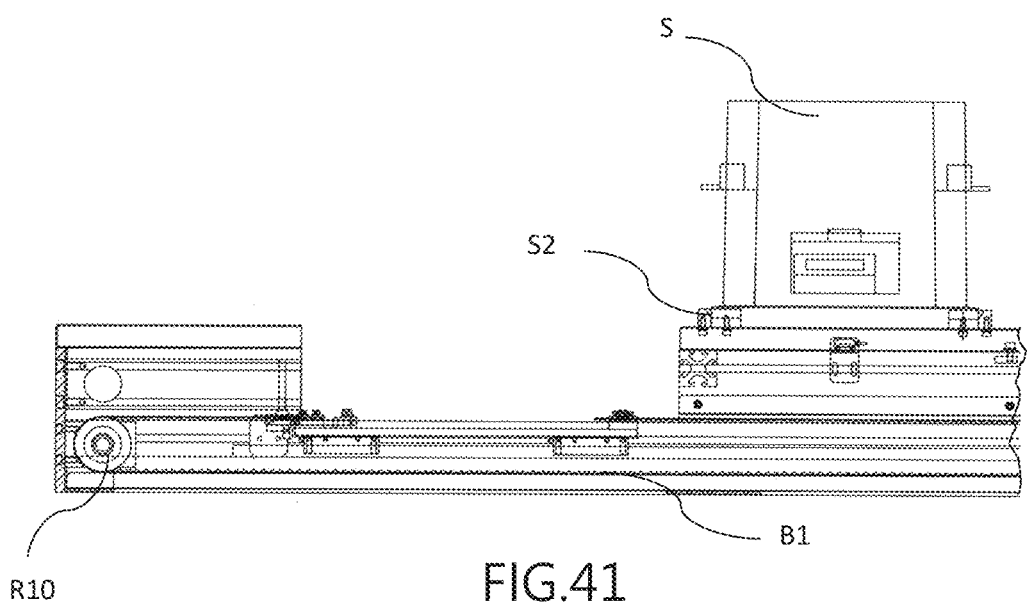
FIG. 41 is a left side schematic view of the arm gripping the wafer cassette structure body wafer cassette warehouse arrangement of the semiconductor wafer cassette warehouse transportation structure system of the invention.
Figure 42:
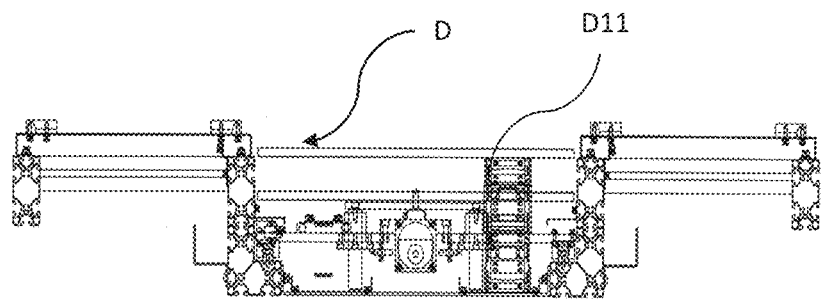
FIG. 42 is a side sectional view of FIG. 35 showing the arm gripping the wafer cassette structure of the semiconductor wafer cassette warehouse transportation structure system of the invention.
Figure 43:
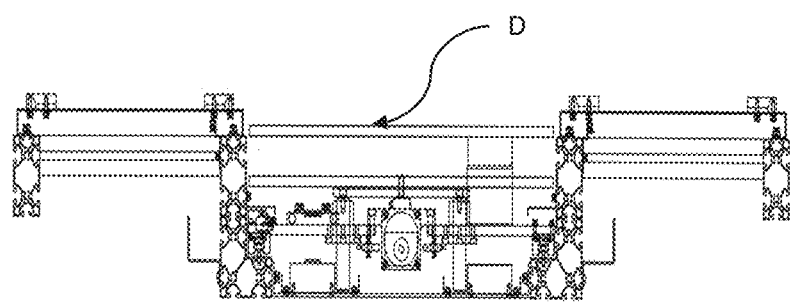
FIG. 43 is a side sectional view of FIG. 38 showing the arm gripping the wafer cassette structure of the semiconductor wafer cassette warehouse transportation structure system of the invention.
Figure 44:
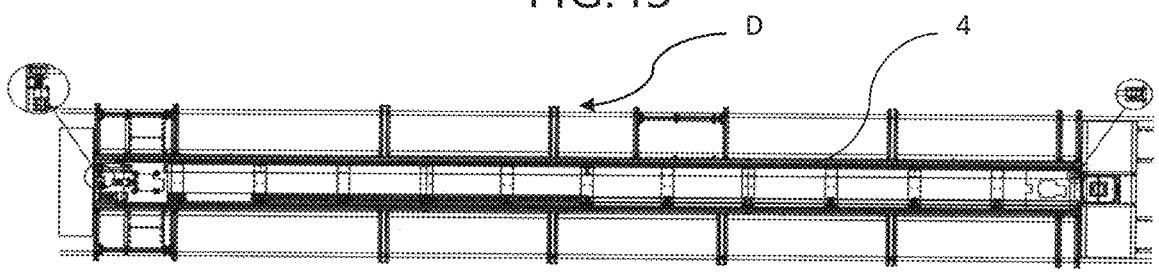
FIG. 44 is a top view showing the arm gripping the wafer cassette structure of the semiconductor wafer cassette warehouse transportation structure system of the invention.

As shown in FIGS. 32 to 46 specifically, the arm gripping wafer cassette structure body D and the wafer cassettes S are lifted by the wafer cassette lift transportation structure body A to the wafer cassette frame structure body B and in turn, are sent to the wafer cassette S by the roller transportation device 3. The arm tracks C11, C12 of the arm structure body C grip the wafer cassette S run on the roller transportation device 3. A track D1, mounted on an L-shaped plate D11 at a left side of the arm seat C2 under the arm structure C1, as means for running the arm structure body C on the tracks 4 (see FIGS. 33, 34).

Figure 45:
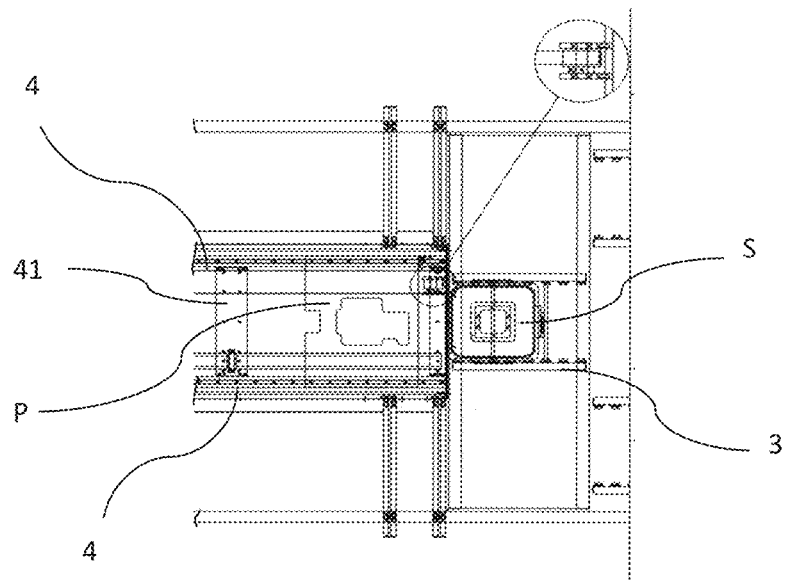
FIG. 45 schematically depicts a partial, right side of the top view of the arm gripping the wafer cassette structure of the semiconductor wafer cassette warehouse transportation structure system of the invention.
Figure 46:
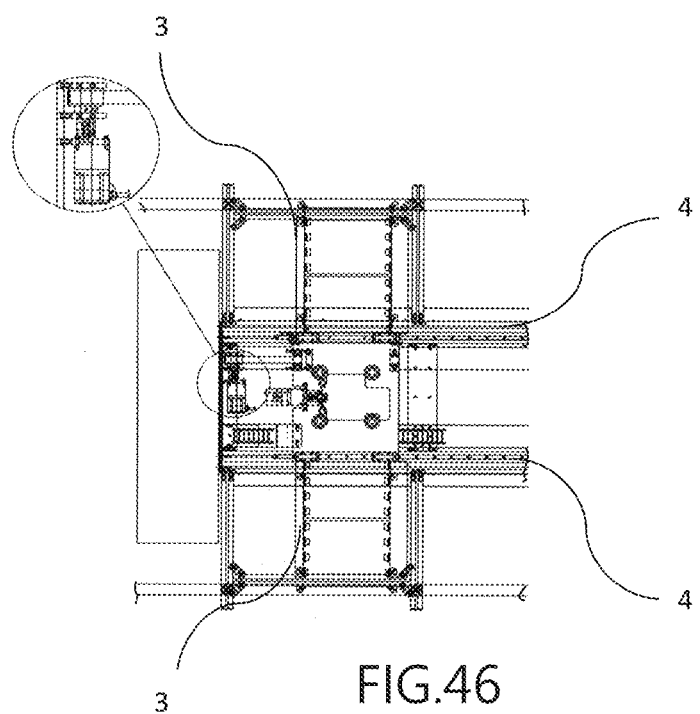
FIG. 46 schematically depicts a partial, left side of the top view of the arm gripping the wafer cassette structure of the semiconductor wafer cassette warehouse transportation structure system of the invention.
Figure 47:
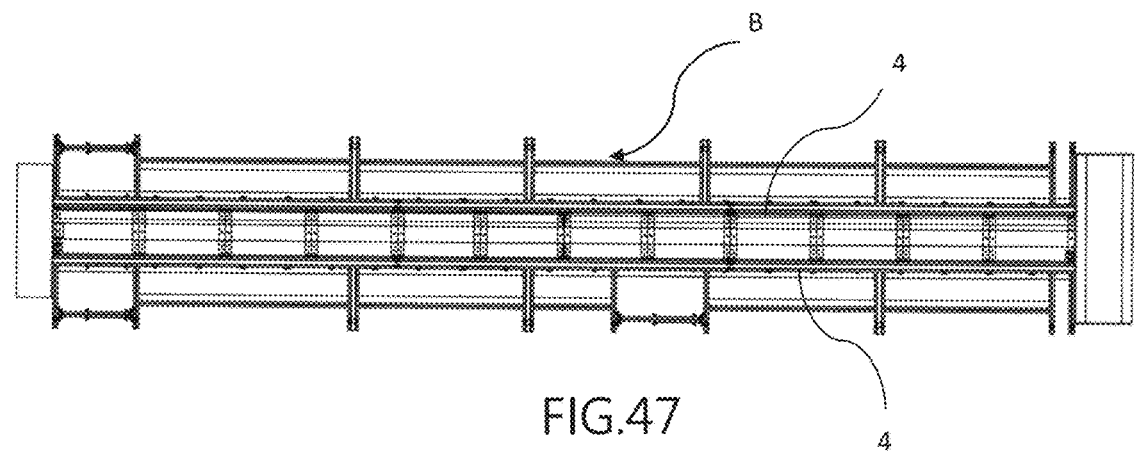
FIG. 47 schematically depicts the wafer cassette warehouse structure body being unoccupied wafer cassette architecture of the semiconductor wafer cassette warehouse transportation structure system of the invention.
Figure 48:
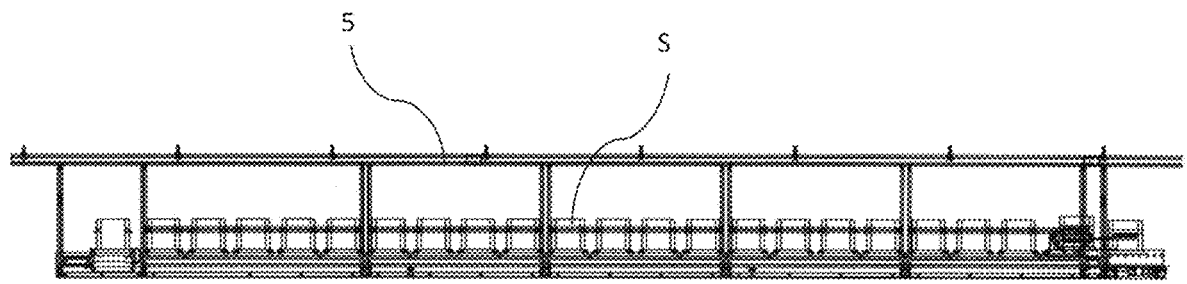
FIG. 48 is a front view showing the wafer cassette warehouse structure body being a wafer cassette warehouse of the semiconductor wafer cassette warehouse transportation structure system of the invention.
Figure 49:
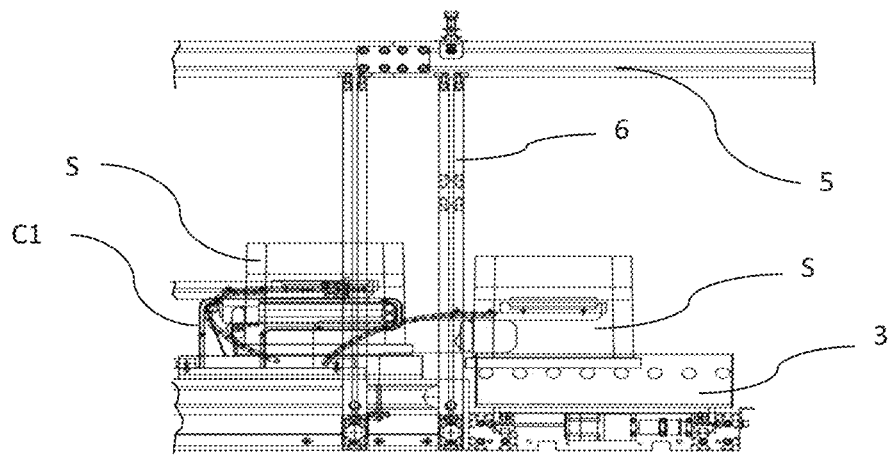
FIG. 49 is a partial, right side view showing the wafer cassette warehouse structure body being a wafer cassette warehouse of the semiconductor wafer cassette warehouse transportation structure system of the invention.
Figure 50:
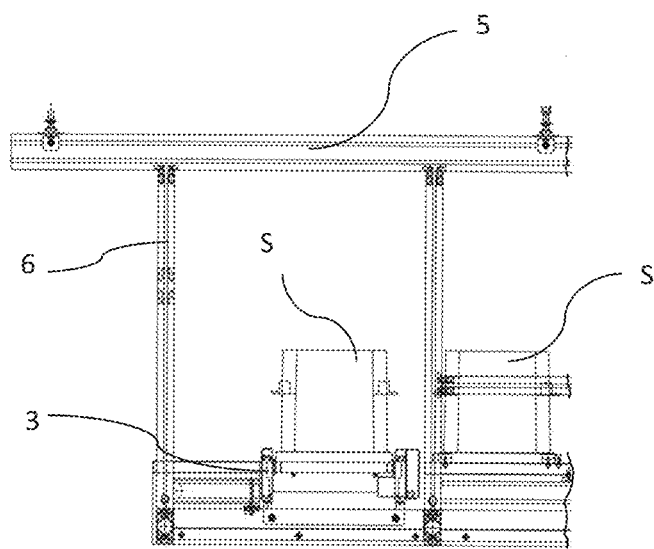
FIG. 50 is a partial, left side view showing the wafer cassette warehouse structure body being a wafer cassette warehouse of the semiconductor wafer cassette warehouse transportation structure system of the invention.
Figure 51:
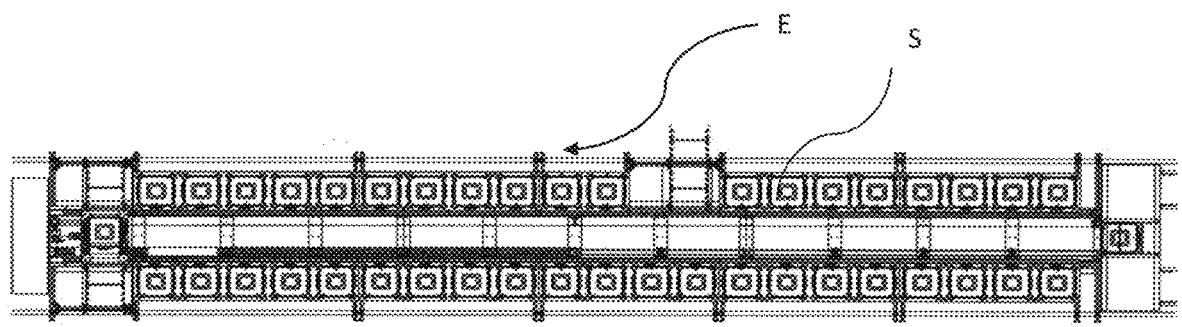
FIG. 51 is a top view showing the wafer cassette warehouse structure body being a wafer cassette warehouse of the semiconductor wafer cassette warehouse transportation structure system of the invention.
Figure 52:
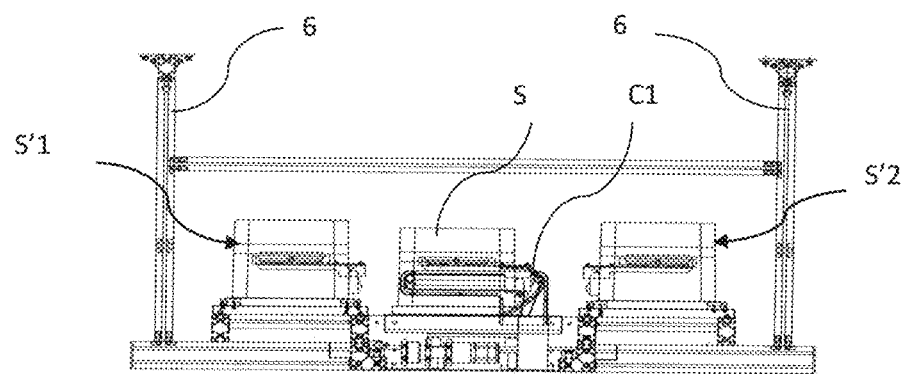
FIG. 52 is a left side, sectional view showing the wafer cassette warehouse structure body being a wafer cassette warehouse of the semiconductor wafer cassette warehouse transportation structure system of the invention.
Figure 53:
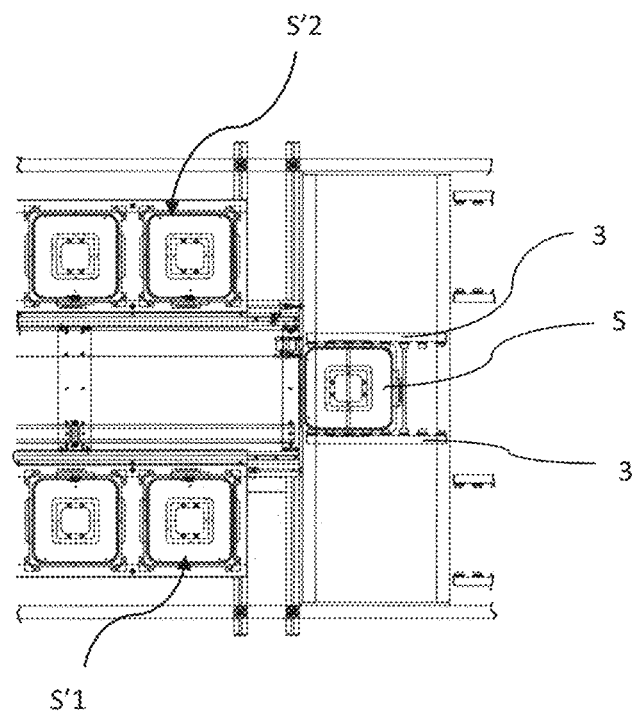
FIG. 53 is a right side, sectional view showing the wafer cassette warehouse structure body being a wafer cassette warehouse of the semiconductor wafer cassette warehouse transportation structure system of the invention.
Figure 54:
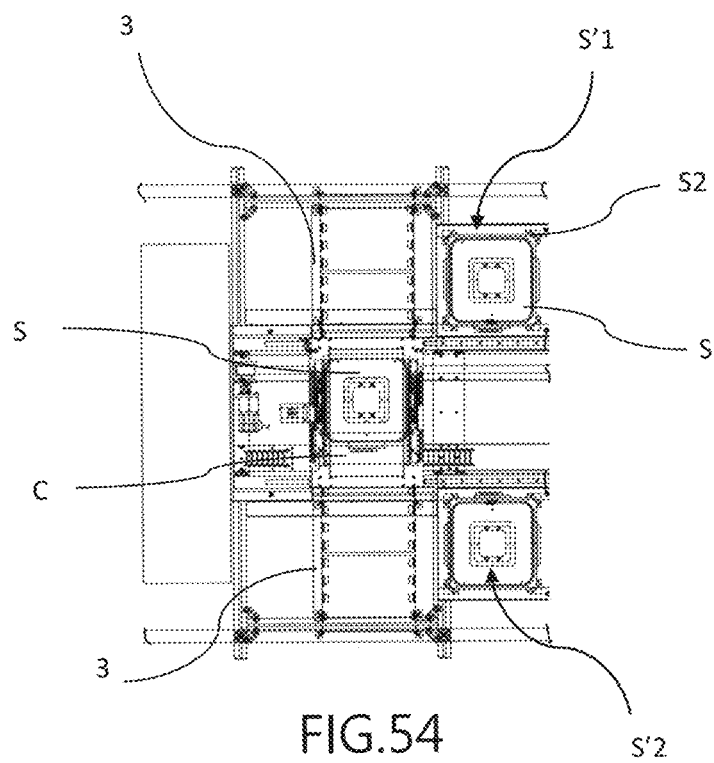
FIG. 54 is a left side, partial view showing the wafer cassette warehouse structure body being a wafer cassette warehouse of the semiconductor wafer cassette warehouse transportation structure system of the invention.
Figure 55:
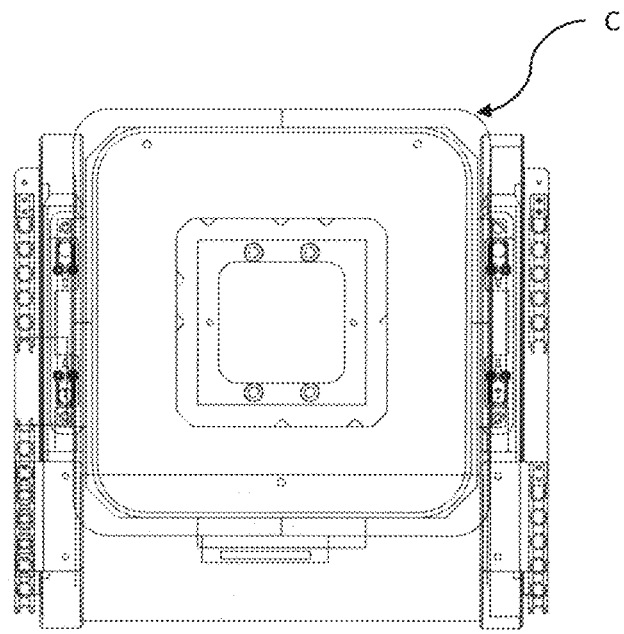
FIG. 55 schematically depicts the left side lift structural frame body of the wafer cassette warehouse structure body being a wafer cassette warehouse of the semiconductor wafer cassette warehouse transportation structure system of the invention.

As shown in FIGS. 35 to 46 specifically, the arm structure body C of the arm gripping wafer cassette structure body D stores the wafer cassettes S as a wafer cassette group S1'. Rollers R9, R10 are mounted at sides of the track respectively and a belt B1 runs to rotate the rollers R9, R10. In which the wafer cassette S is positioned by four positioning blocks S2 at four corners thereof respectively. As shown in FIG. 45 specifically, the wafer cassette S runs on the roller transportation device 3, a support plate P and the parallel U-shaped connecting plates 42 are mounted at an inlet of the track 4.

As shown in FIGS. 47 to 56 specifically, the wafer cassette warehouse structure body E is suspended on the ceiling by means of the suspension support rod 5 and the auxiliary support rod 6. The arm structure body C puts the wafer cassettes S on the storage frame 8. As shown in FIGS. 52 to 56 specifically, at an intermediate portion of the suspension support rods 5, the arm structure body C grips the wafer cassettes S and puts them on the storage frame 8 to form a wafer cassette group S'1. The wafer cassettes S on the right side of the storage frame 8 form a wafer cassette group S'2. The wafer cassette S is placed on the storage frame 8 and is positioned by the four positioning blocks S2 at four corners thereof respectively.

While the invention has been described in terms of preferred embodiments, those skilled in the art will recognize that the invention can be practiced with modifications within the spirit and scope of the appended claims.

What is claimed is:

1. A semiconductor wafer cassette warehouse transportation structure system, comprising a wafer cassette lift transportation structure body, a wafer cassette frame structure body, an arm structure body, an arm gripping wafer cassette structure body, and a wafer cassette warehouse structure body wherein:

the wafer cassette lift transportation structure body is shaped as a parallelepiped ladder structure and includes a lift structural frame, a plurality of positioning devices, and a plurality of roller transportation devices; the lift structural frame includes a plurality of support rods and is shaped as a rectangular frame; the plurality of positioning devices are provided at either side of the support rod as a left wing for supporting a plurality of wafer cassettes which are put on the plurality of roller transportation devices; the plurality of roller transportation devices convey the plurality of wafer cassettes to the lift structural frame; one of the plurality of roller transportation devices conveys the plurality of wafer cassettes along an input direction; and the one of the plurality of roller transportation devices conveys the plurality of wafer cassettes along an output direction;

the wafer cassette frame structure body includes a plurality of connected tracks, a plurality of suspension support rods, a plurality of auxiliary support rods, a plurality of linking rods, and a plurality of storage frames; the plurality of wafer cassettes move on the plurality of connected tracks; the plurality of suspension support rods are suspended on a ceiling and connected to the plurality of auxiliary support rods; the plurality of linking rods are connected to the plurality of connected tracks with the plurality of storage frames mounted thereon so that the plurality of wafer cassettes are configured to temporarily store on the plurality of storage frames;

the arm structure body includes an arm structure, an arm seat and a wafer cassette seat; the arm structure is L-shaped as an and is mounted across two sides of the wafer cassette seat; two internal first rollers are provided at two sides of the wafer cassette seat respectively; a first belt is provided to run on the two internal first rollers; a second belt is provided in the arm structure and runs on a plurality of second rollers; two arm tracks are provided at two sides respectively and are extended to a side wing at either side of each of the plurality of wafer cassettes so that the plurality of wafer cassettes are configured for access; and the arm seat is mounted on a bottom of the arm structure as a support arm structure;

the arm gripping wafer cassette structure body and the plurality of wafer cassettes stored in the arm gripping wafer cassette structure body are lifted to the wafer cassette frame structure body by the wafer cassette lift transportation structure body, and the plurality of wafer cassettes are transported by the plurality of roller transportation devices; the two arm tracks of the arm structure body grip one of the plurality of wafer cassettes to run on the plurality of roller transportation devices; a track member is provided on an L-shaped plate at a left side of the arm seat under the arm structure for running the arm structure body on the plurality of connected tracks;

the wafer cassette warehouse structure body is suspended on the ceiling by the plurality of suspension support rods and the plurality of auxiliary support rods; the arm structure body puts the plurality of wafer cassettes on the plurality of storage frames; at an intermediate portion of the plurality of suspension support rods, the arm structure body grips the plurality of wafer cassettes and puts the plurality of wafer cassettes on the plurality of storage frames to form a first wafer cassette group; the plurality of wafer cassettes put on a right side of the plurality of storage frames form a second wafer cassette group; and each of the plurality of wafer cassettes is placed on one of the plurality of storage frames and is positioned by the four positioning blocks at four corners thereof respectively; and the plurality of wafer cassettes are lifted to the wafer cassette frame structure body suspended at the ceiling by the wafer cassette lift transportation structure body; the arm structure body grips the one of the plurality of wafer cassettes by using arms; and the plurality of wafer cassettes stored in the wafer cassette frame structure body are configured for access.

2. The semiconductor wafer cassette warehouse transportation structure system of claim 1, wherein each of the plurality of positioning devices includes two roller members and a block member secured to the two roller members.

3. The semiconductor wafer cassette warehouse transportation structure system of claim 1, wherein each of the plurality of connected tracks includes two parallel rails and two parallel U-shaped connecting plates interconnected to the two parallel rails; each of the plurality of auxiliary support rods include an L-shaped rod, a cross rod, and a triangular block joined the L-shaped rod and the cross rod together; one of the plurality of storage frames and an auxiliary block are assembled; and one of the plurality of auxiliary support rods and one of the plurality of suspension support rods are assembled.

4. The semiconductor wafer cassette warehouse transportation structure system of claim 1, wherein the arm structure body of the arm gripping wafer cassette structure body stores the plurality of wafer cassettes as a wafer cassette group member; each of the plurality of wafer cassettes are positioned by four positioning blocks at four corners thereof respectively; and each of the plurality of wafer cassettes run on one of the plurality of roller transportation devices; further comprising a support plate; and wherein the support plate and the two parallel U-shaped connecting plates are mounted at an inlet of the plurality of connected tracks.

5. The semiconductor wafer cassette warehouse transportation structure system of claim 1, further comprising a first motor mounted at an intermediate portion of the arm seat; a position sensor mounted at one side of the motor; a second motor and a belt grip both mounted at one side surface of the arm seat; and the belt grip grips the first or second belt so as to activate the arm structure.

* * * * *